United States Patent
Yamazaki et al.

(10) Patent No.: US 10,852,194 B2
(45) Date of Patent: Dec. 1, 2020

(54) LIGHT DETECTOR

(71) Applicant: HAMAMATSU PHOTONICS K.K., Hamamatsu (JP)

(72) Inventors: Masahiro Yamazaki, Hamamatsu (JP); Katsumi Shibayama, Hamamatsu (JP); Ryusuke Kitaura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/468,046

(22) PCT Filed: Nov. 30, 2017

(86) PCT No.: PCT/JP2017/043174
§ 371 (c)(1),
(2) Date: Jun. 10, 2019

(87) PCT Pub. No.: WO2018/110310
PCT Pub. Date: Jun. 21, 2018

(65) Prior Publication Data
US 2020/0072676 A1    Mar. 5, 2020

(30) Foreign Application Priority Data

Dec. 14, 2016 (JP) ................................ 2016-242467

(51) Int. Cl.
*G01J 5/20* (2006.01)
(52) U.S. Cl.
CPC ...................... *G01J 5/20* (2013.01)
(58) Field of Classification Search
CPC ........ G01J 5/20; H01L 27/144; H01L 27/146; H01L 31/0248
See application file for complete search history.

(56) References Cited

U.S. PATENT DOCUMENTS

| 5,021,663 A | 6/1991 | Hornbeck |
| 5,397,897 A * | 3/1995 | Komatsu ................ G01J 5/045 |
| | | 250/338.4 |

(Continued)

FOREIGN PATENT DOCUMENTS

| CN | 104781641 A | 7/2015 |
| CN | 105737993 A | 7/2016 |

(Continued)

OTHER PUBLICATIONS

International Preliminary Report on Patentability dated Jun. 27, 2019 for PCT/JP2017/043174.

*Primary Examiner* — Marcus H Taningco
(74) *Attorney, Agent, or Firm* — Faegre Drinker Biddle & Reath LLP

(57) ABSTRACT

A light detector includes: a substrate; and a membrane, in which the membrane includes a first wiring layer and a second wiring layer which are opposite each other with a gap extending along a line interposed therebetween, a resistance layer which is electrically connected to each of the first wiring layer and the second wiring layer and has an electric resistance depending on a temperature, a light absorption layer, and a separation layer which is disposed between each of the first wiring layer and the second wiring layer and the light absorption layer, and in which the light absorption layer includes a first region which spreads to the side opposite to the second wiring layer with respect to the first wiring layer and a second region which spreads to the side opposite to the first wiring layer with respect to the second wiring layer.

7 Claims, 12 Drawing Sheets

(56) References Cited

U.S. PATENT DOCUMENTS

| | | |
|---|---|---|
| 6,229,144 B1 | 5/2001 | Ouvrier-Buffet et al. |
| 6,426,539 B1 | 7/2002 | Vilain et al. |
| 9,404,804 B1* | 8/2016 | Liu .................... G01J 5/0225 |
| 2002/0039838 A1* | 4/2002 | Iida .................... H01L 27/1467 |
| | | 438/689 |
| 2004/0089807 A1* | 5/2004 | Wada .................... G01J 5/20 |
| | | 250/338.1 |
| 2004/0140428 A1 | 7/2004 | Ionescu et al. |
| 2005/0082481 A1 | 4/2005 | Vilain |
| 2009/0140148 A1* | 6/2009 | Yang .................... G01J 5/20 |
| | | 250/338.4 |
| 2011/0042569 A1 | 2/2011 | Cho et al. |
| 2012/0119088 A1* | 5/2012 | Honda .................... G01J 5/024 |
| | | 250/332 |
| 2012/0132804 A1 | 5/2012 | Lee et al. |
| 2012/0235045 A1* | 9/2012 | Kurashina ............ G01J 5/0225 |
| | | 250/353 |

FOREIGN PATENT DOCUMENTS

| | | |
|---|---|---|
| JP | 2001-272271 A | 10/2001 |
| JP | 2002-214035 A | 7/2002 |
| JP | 2003-294523 A | 10/2003 |
| JP | 2004-151059 A | 5/2004 |
| JP | 2014-190894 A | 10/2014 |

\* cited by examiner

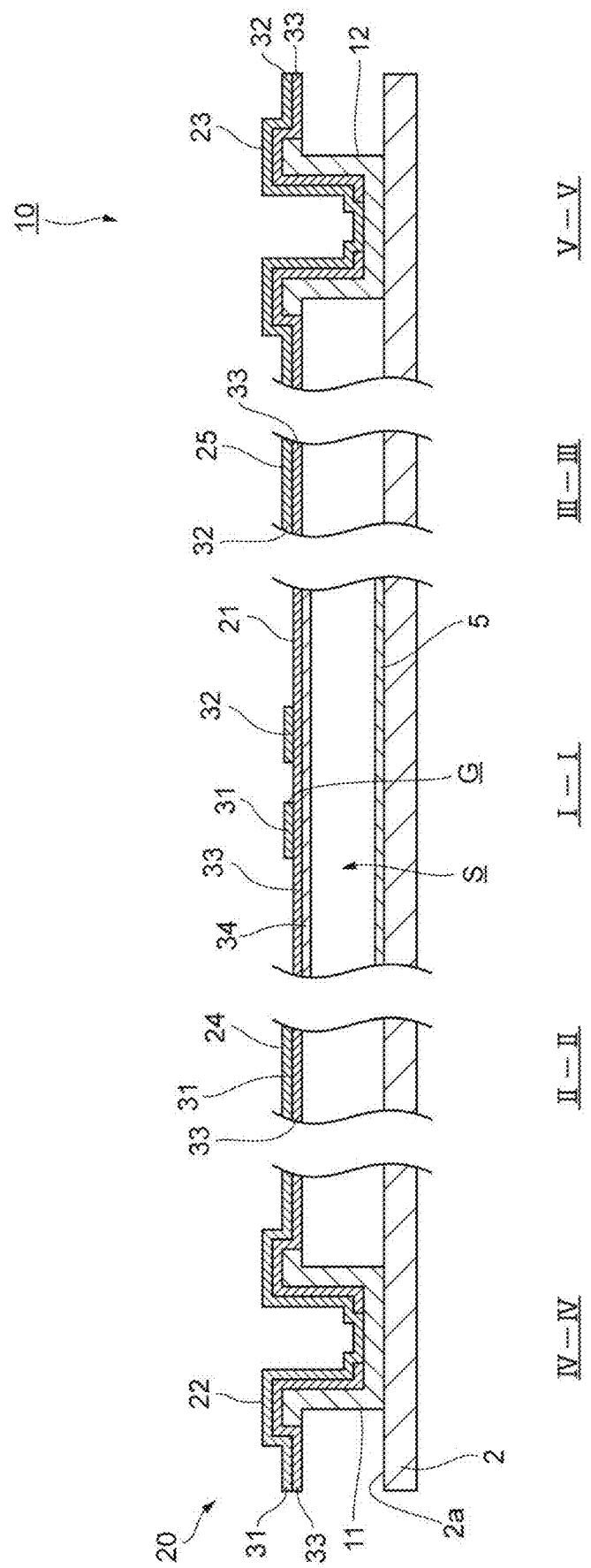

LIGHT DETECTOR

TECHNICAL FIELD

An aspect of the invention relates to a light detector.

BACKGROUND ART

As a light detector, one including a substrate and a membrane supported on a surface of the substrate so that a space is formed between the surface of the substrate and the membrane is known and the membrane includes a pair of wiring layers opposite each other with a gap interposed therebetween and a resistance layer having an electric resistance depending on a temperature (for example, see Patent Literature 1). In a device described in Patent Literature 1, a pair of electrodes corresponding to a pair of wiring layers spreads to the entire region of the membrane except for the gap and light absorption is performed by the pair of electrodes.

CITATION LIST

Patent Literature

Patent Literature 1: U.S. Pat. No. 6,426,539

SUMMARY OF INVENTION

Technical Problem

However, as in the device described in Patent Literature 1, when the pair of wiring layers spreads to the entire region of the membrane except for the gap, heat generated by the light absorption easily escapes to the substrate through the wiring layer and hence improvement of sensitivity is limited.

Here, an object of an aspect of the invention is to provide a light detector capable of improving sensitivity.

Solution to Problem

A light detector according to an aspect of the invention includes: a substrate; and a membrane which is supported on a surface of the substrate so that a space is formed between the surface of the substrate and the membrane, in which the membrane includes a first wiring layer and a second wiring layer which are opposite each other with a gap extending along a line interposed therebetween, a resistance layer which is electrically connected to each of the first wiring layer and the second wiring layer and has an electric resistance depending on a temperature, a light absorption layer which is opposite to the surface of the substrate, and a separation layer which is disposed between the first wiring layer and the light absorption layer, and the second wiring layer and the absorption layer, and in which the light absorption layer includes a first region which spreads to the side opposite to the second wiring layer with respect to the first wiring layer when viewed from the thickness direction of the substrate and a second region which spreads to the side opposite to the first wiring layer with respect to the second wiring layer when viewed from the thickness direction of the substrate.

In the light detector, the first region of the light absorption layer spreads to the side opposite to the second wiring layer with respect to the first wiring layer and the second region of the light absorption layer spreads to the side opposite to the first wiring layer with respect to the second wiring layer when viewed from the thickness direction of the substrate. That is, the first region of the light absorption layer does not overlap the first wiring layer and the second region of the light absorption layer does not overlap the second wiring layer when viewed from the thickness direction of the substrate. Accordingly, sufficient light absorption in the first region and the second region of the light absorption layer is realized. Further, the separation layer is disposed between the first wiring layer and the light absorption layer, and the second wiring layer and the absorption layer. Accordingly, since heat generated in the light absorption layer is suppressed from escaping to the substrate through the first wiring layer and the second wiring layer, the heat is sufficiently transmitted to the resistance layer through the separation layer. As described above, according to the light detector, sensitivity can be improved.

The light detector according to an aspect of the invention may further include a light reflection layer which is disposed on the surface of the substrate and constitutes an optical resonance structure along with the light absorption layer. According to this configuration, it is possible to realize light absorption in a wavelength region corresponding to a distance between the light absorption layer and the light reflection layer.

In the light detector according to an aspect of the invention, a total area of the first wiring layer and the second wiring layer may be smaller than a total area of the first region and the second region when viewed from the thickness direction of the substrate. According to this configuration, more sufficient light absorption in the first region and the second region of the light absorption layer is realized and the heat generated in the light absorption layer is further suppressed from escaping to the substrate through the first wiring layer and the second wiring layer, sensitivity can be further improved.

In the light detector according to an aspect of the invention, a total area of the first wiring layer and the second wiring layer may be smaller than a area of each of the first region and the second region when viewed from the thickness direction of the substrate. According to this configuration, since more sufficient light absorption in the first region and the second region of the light absorption layer is realized and the heat generated in the light absorption layer is further suppressed from escaping to the substrate through the first wiring layer and the second wiring layer, sensitivity can be further improved.

In the light detector according to an aspect of the invention, a length of each of the first wiring layer and the second wiring layer in a direction along the line may be larger than a width of each of the first wiring layer and the second wiring layer in a direction perpendicular to the line when viewed from the thickness direction of the substrate. According to this configuration, since the gap is lengthened, sensitivity can be further improved.

In the light detector according to an aspect of the invention, a thickness of the separation layer may be larger than a thickness of each of the first wiring layer, the second wiring layer, the resistance layer, and the light absorption layer. According to this configuration, since heat generated in the light absorption layer is further suppressed from escaping to the substrate through the first wiring layer and the second wiring layer, sensitivity can be further improved.

Advantageous Effects of Invention

According to an aspect of the invention, it is possible to provide a light detector capable of improving sensitivity.

BRIEF DESCRIPTION OF DRAWINGS

FIG. 12 is a cross-sectional view of the light detecting element of the modified example.

DESCRIPTION OF EMBODIMENTS

Figure 1:
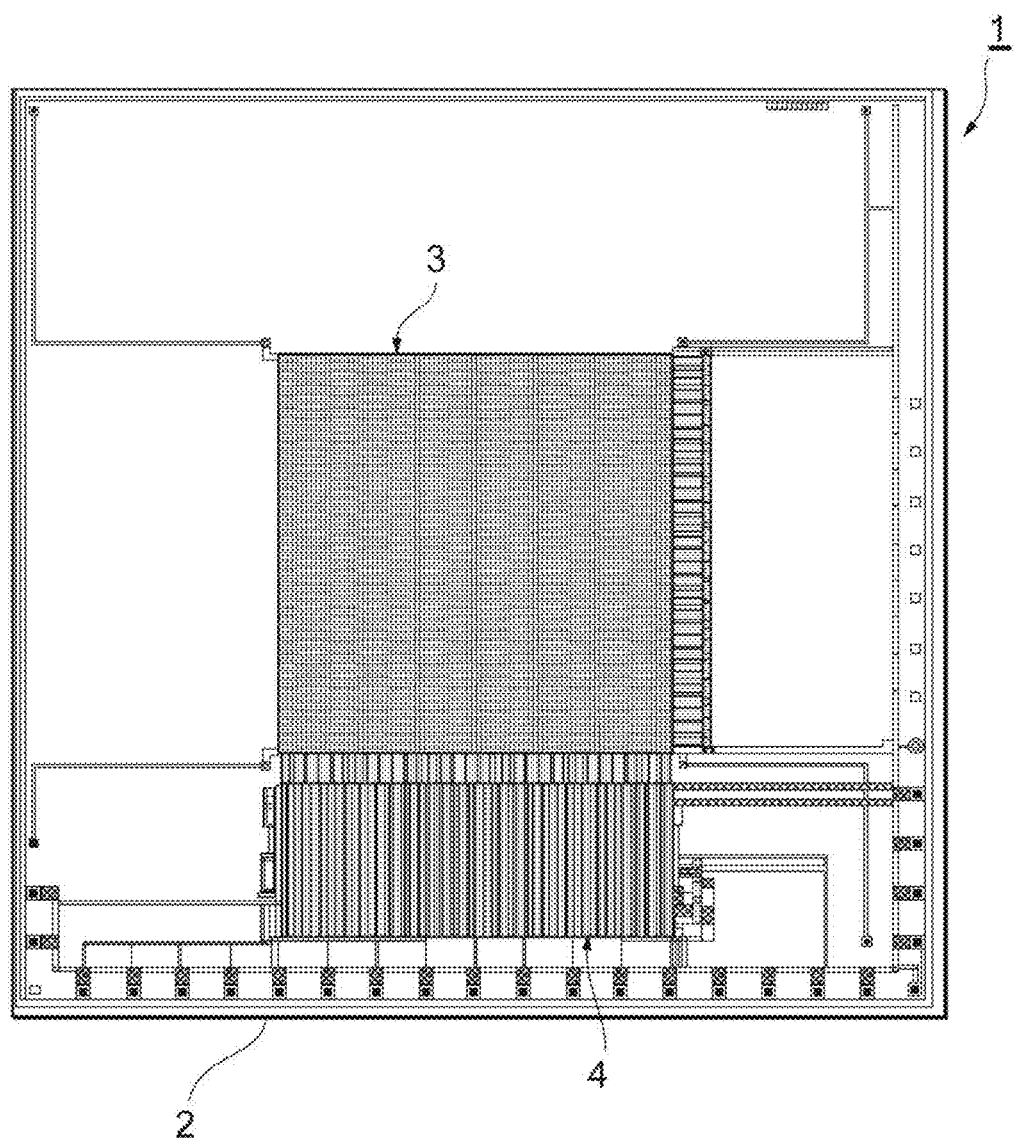
FIG. 1 is a plan view of a light detector of an embodiment.

Hereinafter, a preferred embodiment of the invention will be described in detail with reference to the drawings. Additionally, the same reference numerals will be given to the same or equivalent parts in the drawings and a repetitive description thereof will be omitted.

A light detector 1 illustrated in FIG. 1 detects light by using a function of a bolometer. The light is, for example, infrared light. When the light is infrared light, the light detector 1 is used in an infrared imager, thermography, and the like. As illustrated in FIG. 1, the light detector 1 includes a substrate 2, a pixel unit 3, and a signal processing circuit unit 4. The substrate 2 is, for example, a Si substrate. The thickness of the substrate 2 is, for example, about several hundred μm. The pixel unit 3 and the signal processing circuit unit 4 are formed on the substrate 2 and are electrically connected to each other. Additionally, the signal processing circuit unit 4 may be formed inside the substrate 2.

Figure 2:
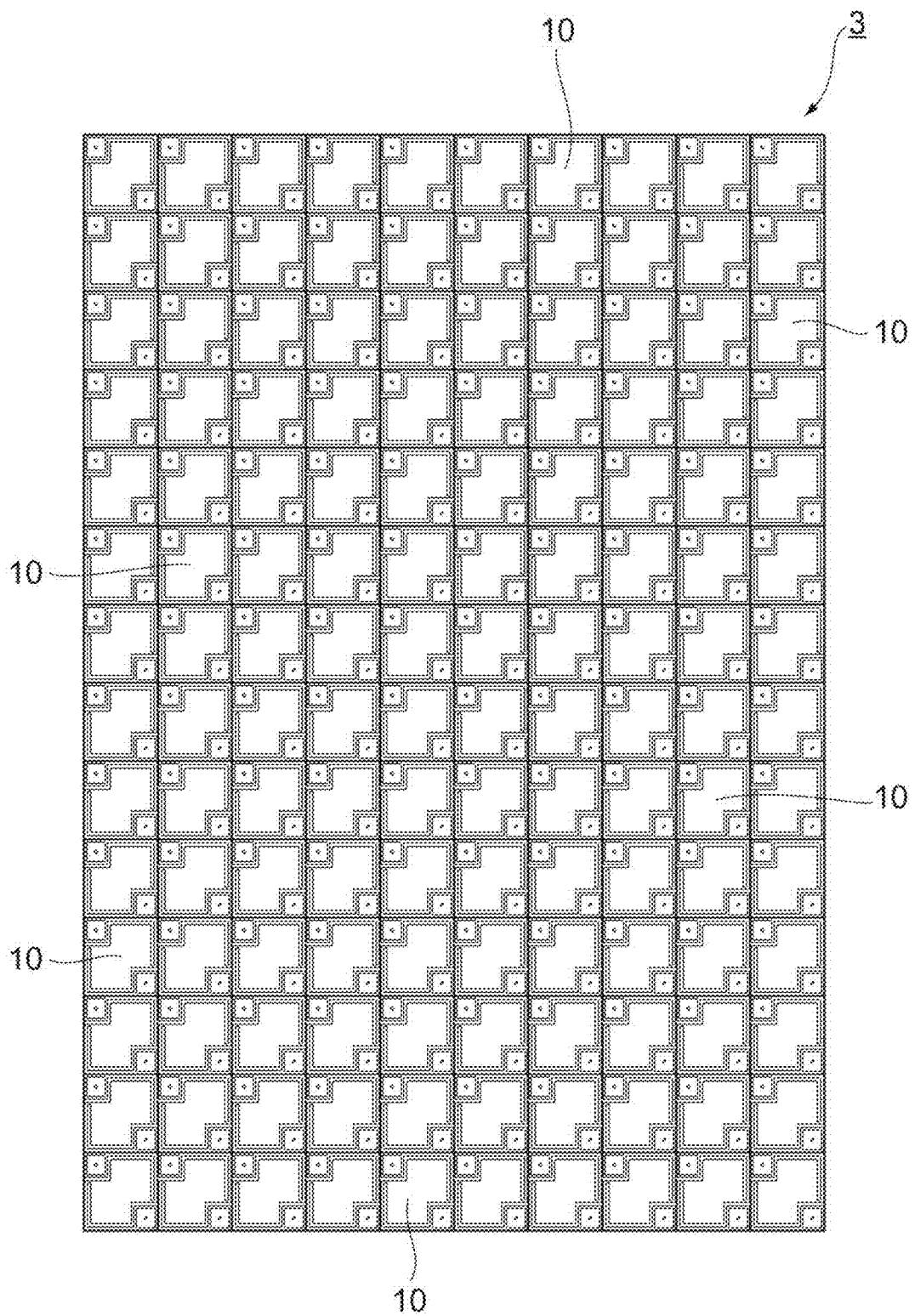
FIG. 2 is a plan view of a pixel unit of the light detector of FIG. 1.
Figure 3:
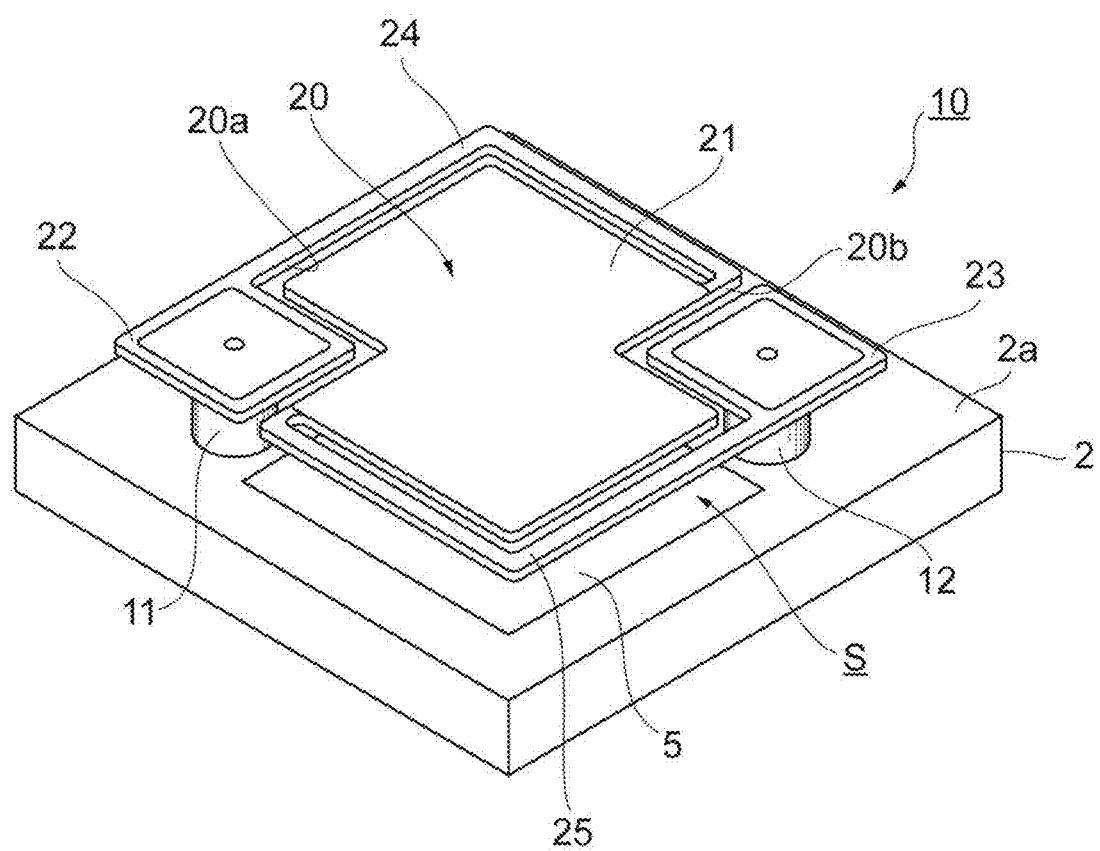
FIG. 3 is a perspective view of a light detecting element of the pixel unit of FIG. 2.

As illustrated in FIG. 2, the pixel unit 3 includes a plurality of light detecting elements 10. The plurality of light detecting elements 10 are arranged in a two-dimensional matrix shape. As illustrated in FIG. 3, the light detecting element 10 includes the substrate 2 (exactly a part of the substrate 2), a light reflection layer 5, a pair of electrode plugs 11 and 12, and a membrane 20.

The light reflection layer 5 is formed on a surface 2a of the substrate 2. The light reflection layer 5 is opposite to a light absorption layer 34 to be described later and constitutes an optical resonance structure along with the light absorption layer 34. The thickness of the light reflection layer 5 is, for example, about several hundreds of nm. The material of the light reflection layer 5 is, for example, a metal material (for example, Al or the like) having large reflectivity with respect to light (for example, infrared light).

The pair of electrode plugs 11 and 12 is formed on the surface 2a of the substrate 2. Each of the electrode plugs 11 and 12 is formed in, for example, a columnar shape. The height of each of the electrode plugs 11 and 12 is, for example, about several μm. The material of each of the electrode plugs 11 and 12 is, for example, a metal material such as Ti. The pair of electrode plugs 11 and 12 supports the membrane 20 on the surface 2a of the substrate 2 so that a space S is formed between the surface 2a of the substrate 2 and the membrane 20. The membrane 20 is disposed in substantially parallel to the surface 2a of the substrate 2. A distance between the membrane 20 and the surface 2a of the substrate 2 is, for example, about several μm.

Figure 4:
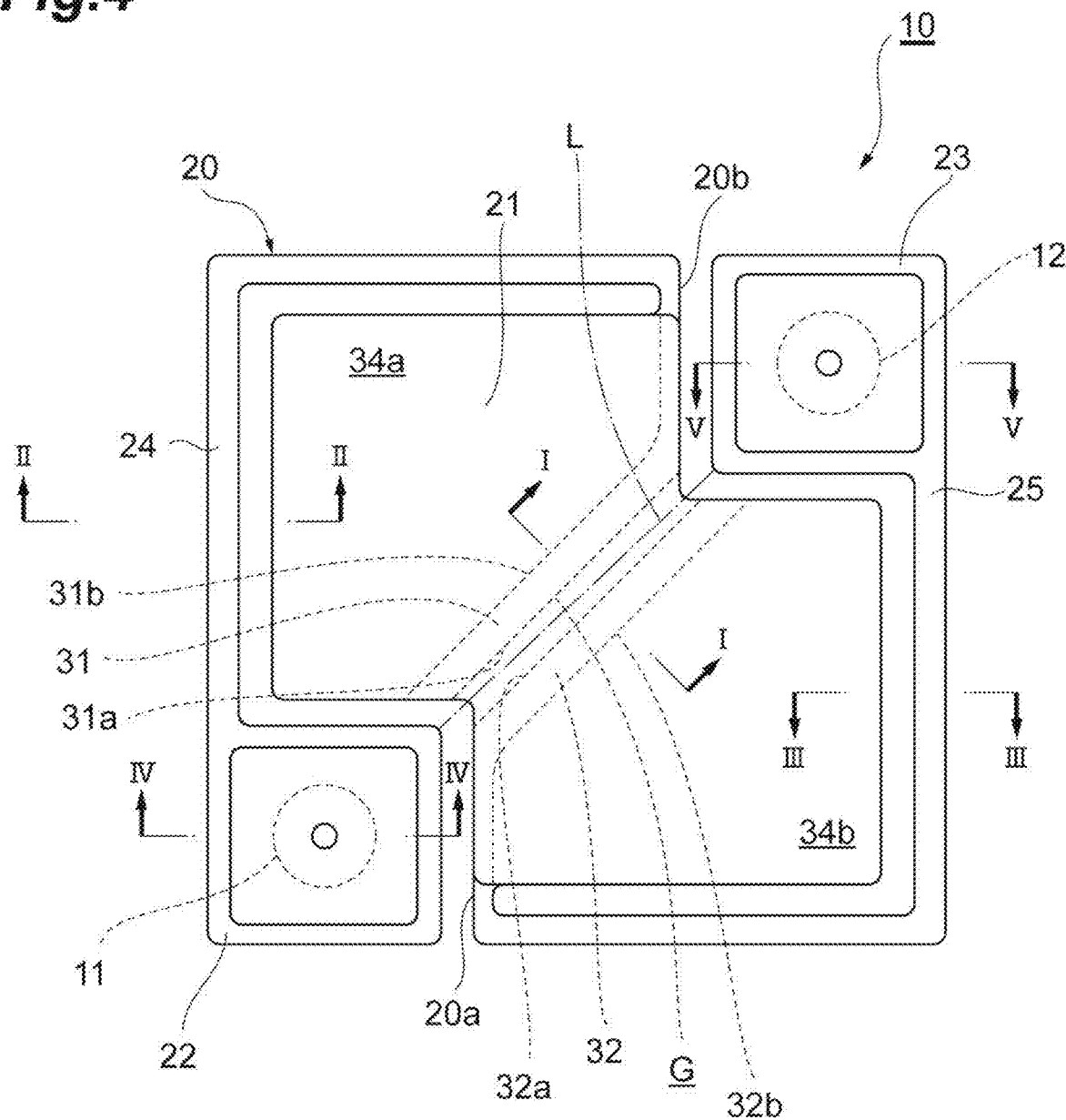
FIG. 4 is a plan view of the light detecting element of FIG. 3.

As illustrated in FIGS. 3 and 4, the membrane 20 includes a light receiving portion 21, a pair of electrode portions 22 and 23, and a pair of beam portions 24 and 25. The light receiving portion 21 spreads to avoid each of the electrode plugs 11 and 12 when viewed from the thickness direction of the substrate 2 (that is, a direction perpendicular to the surface 2a of the substrate 2). The electrode portion 22 is disposed on the electrode plug 11. The electrode portion 23 is disposed on the electrode plug 12. The beam portion 24 extends along the outer edge of the light receiving portion 21 at one side of the light receiving portion 21. The beam portion 25 extends along the outer edge of the light receiving portion 21 at the other side of the light receiving portion 21. One end of the beam portion 24 is connected to the electrode portion 22 and the other end of the beam portion 24 is connected to the light receiving portion 21 at a position in the vicinity of the electrode portion 23. One end of the beam portion 25 is connected to the electrode portion 23 and the other end of the beam portion 25 is connected to the light receiving portion 21 at a position in the vicinity of the electrode portion 22. The membrane 20 has, for example, a rectangular shape when viewed from the thickness direction of the substrate 2. The pair of electrode portions 22 and 23 is respectively provided at diagonal positions of the membrane 20.

The light receiving portion 21, the pair of electrode portions 22 and 23, and the pair of beam portions 24 and 25 are integrally formed with one another. Slits 20a are formed in series between the light receiving portion 21 and the electrode portion 22 and between the light receiving portion 21 and the beam portion 24. Slits 20b are formed in series between the light receiving portion 21 and the electrode portion 23 and between the light receiving portion 21 and the beam portion 25. The width of each of the beam portions 24 and 25 is, for example, about several m and the length of each of the beam portions 24 and 25 is, for example, about several tens of μm. The width of each of the slits 20a and 20b is, for example, about several μm.

Figure 5:
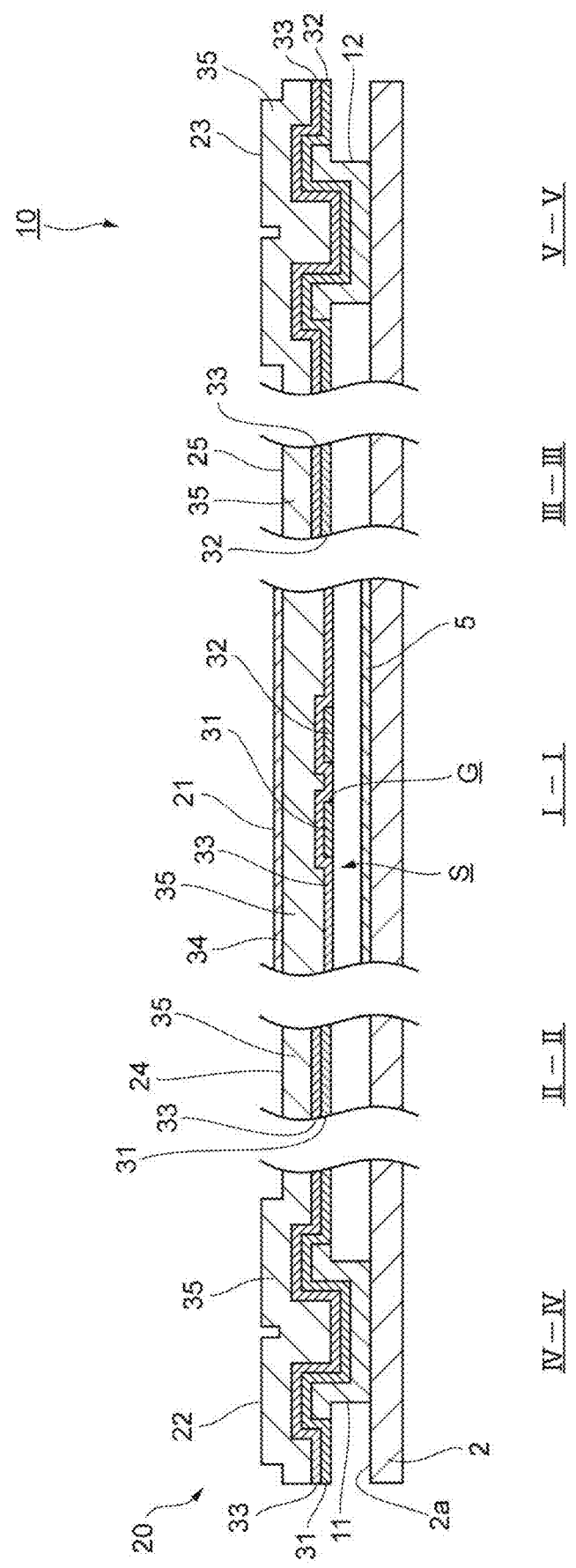
FIG. 5 is a cross-sectional view of the light detecting element of FIG. 3.

FIG. 5 is a cross-sectional view of the light detecting element 10. The I-I, II-II, III-III, IV-IV, and V-V of FIG. 5 are cross-sectional views taken along the lines I-I, II-II, III-III, IV-IV, and V-V of FIG. 4. As illustrated in FIG. 5, the membrane 20 includes a first wiring layer 31, a second wiring layer 32, a resistance layer 33, a light absorption layer 34, and a separation layer 35.

As illustrated in FIGS. 4 and 5, When viewed from the thickness direction of the substrate 2, the first wiring layer 31 and the second wiring layer 32 are opposite each other with the gap G interposed therebetween in the light receiving portion 21. The gap G extends along the line L. The line L extends in, for example, a linear shape to connect the electrode portion 22 and the electrode portion 23 when viewed from the thickness direction of the substrate 2. The first wiring layer 31 and the second wiring layer 32 are formed in an elongated shape in a direction along the line L in the light receiving portion 21. That is, the length of each of the first wiring layer 31 and the second wiring layer 32 in a direction along the line L in the light receiving portion 21 is larger than the width of each of the first wiring layer 31 and the second wiring layer 32 in a direction perpendicular to the line L when viewed from the thickness direction of the substrate 2.

Specifically, the first wiring layer 31 includes a first edge portion 31a and a second edge portion 31b in the light receiving portion 21. When viewed from the thickness direction of the substrate 2, each of the first edge portion 31a and the second edge portion 31b extends along the line L. The second wiring layer 32 includes a third edge portion 32a and a fourth edge portion 32b in the light receiving portion 21. When viewed from the thickness direction of the substrate 2, each of the third edge portion 32a and the fourth edge portion 32b extends along the line L. When viewed from the thickness direction of the substrate 2, the first edge portion 31a and the third edge portion 32a are opposite each other with the line L interposed therebetween. That is, when viewed from the thickness direction of the substrate 2, the gap G is defined by the first edge portion 31a and the third edge portion 32a.

When viewed from the thickness direction of the substrate 2, the length of each of the first wiring layer 31 and the second wiring layer 32 in a direction along the line L of the light receiving portion 21 is, for example, several tens to several hundreds of μm. When viewed from the thickness direction of the substrate 2, the width of each of the first wiring layer 31 and the second wiring layer 32 in a direction perpendicular to the line L is, for example, about several m. When viewed from the thickness direction of the substrate 2, the width of the gap G in a direction perpendicular to the line L is, for example, about several μm. The thickness of each of the first wiring layer 31 and the second wiring layer 32 is, for example, about several tens to several hundreds of nm.

The first wiring layer 31 extends from the light receiving portion 21 to the electrode portion 22 through the beam portion 24. The first wiring layer 31 is formed on the electrode plug 11 in the electrode portion 22. The first wiring layer 31 is electrically connected to the electrode plug 11. The second wiring layer 32 extends from the light receiving portion 21 to the electrode portion 23 through the beam portion 25. The second wiring layer 32 is formed on the electrode plug 12 in the electrode portion 23. The second wiring layer 32 is electrically connected to the electrode plug 12. The material of each of the first wiring layer 31 and the second wiring layer 32 is, for example, a metal material such as Ti.

The resistance layer 33 is formed to cover the first wiring layer 31 and the second wiring layer 32 from the side opposite to the substrate 2 in the light receiving portion 21. The resistance layer 33 covers the surface opposite to the substrate 2 of each of the first wiring layer 31 and the second wiring layer 32 in the light receiving portion 21 and the side surface of each of the first wiring layer 31 and the second wiring layer 32. That is, the resistance layer 33 is disposed in the gap G. The resistance layer 33 is formed on the surface opposite to the substrate 2 of the first wiring layer 31 and the second wiring layer 32 in the electrode portions 22 and 23 and the beam portions 24 and 25. The resistance layer 33 is electrically connected to each of the first wiring layer 31 and the second wiring layer 32. The thickness of the resistance layer 33 is, for example, about several tens to several hundreds of nm. The resistance layer 33 has an electric resistance depending on a temperature. The material of the resistance layer 33 is, for example, a material having a large change in electrical resistivity due to a temperature change such as amorphous silicon (a-Si).

The light absorption layer 34 is opposite to the surface 2a of the substrate 2 of the light receiving portion 21. The light absorption layer 34 is disposed at the side opposite to the substrate 2 with respect to the resistance layer 33. The light absorption layer 34 spreads in the substantially entire region of the light receiving portion 21 when viewed from the thickness direction of the substrate 2. The thickness of the light absorption layer 34 is, for example, about several tens of nm. The material of the light absorption layer 34 is, for example, $WSi_2$ or Ti.

The separation layer 35 is disposed between the first wiring layer 31 and the light absorption layer 34, and the second wiring layer 32 and the absorption layer 34. Specifically, the separation layer 35 is formed on the surface opposite to the substrate 2 of the resistance layer 33 in the light receiving portion 21, the beam portions 24 and 25, and the electrode portions 22 and 23. Then, the light absorption layer 34 is formed on the surface at the side opposite to the substrate 2 in the separation layer 35 of the light receiving portion 21. The thickness of the separation layer 35 is, for example, about several hundreds of nm. The thickness of the separation layer 35 is larger than the thickness of each of the first wiring layer 31, the second wiring layer 32, the resistance layer 33, and the light absorption layer 34. The material of the separation layer 35 is, for example, a silicon nitride film (SiN) or the like.

When viewed from the thickness direction of the substrate 2, the light absorption layer 34 includes the first region 34a and the second region 34b. The first region 34a spreads to the side opposite to the second wiring layer 32 with respect to the first wiring layer 31 when viewed from the thickness direction of the substrate 2. The second region 34b spreads to the side opposite to the first wiring layer 31 with respect to the second wiring layer 32 when viewed from the thickness direction of the substrate 2. When viewed from the thickness direction of the substrate 2, the total area of the first wiring layer 31 and the second wiring layer 32 is smaller than each area of the first region 34a and the second region 34b.

Additionally, the first region 34a and the second region 34b of the light absorption layer 34 are formed on the resistance layer 33 with the separation layer 35 interposed therebetween. Further, the resistance layer 33 and the separation layer 35 are respectively formed continuously over the first region 34a and the second region 34b.

In the light detector 1 with the above-described configuration, light is detected as below. First, when incident light is incident to the light receiving portion 21, heat is generated in the light absorption layer 34 constituting an optical resonance structure to be described later. At this time, the light receiving portion 21 and the substrate 2 are thermally separated from each other by a space S. Further, the light receiving portion 21, the electrode portion 22, and the beam portion 24 are thermally separated from one another by the slit 20a. Further, the light receiving portion 21, the electrode portion 23, and the beam portion 25 are thermally separated from one another by the slit 20b. For this reason, heat generated in the light absorption layer 34 is suppressed from escaping to the substrate 2 through the beam portions 24 and 25 and the electrode portions 22 and 23.

The heat generated in the light absorption layer 34 is transmitted to the resistance layer 33 through the separation layer 35. Then, the resistance layer 33 increases in temperature and electric resistance due to the heat. Such a change in electric resistance is transmitted to the signal processing circuit unit 4 as a signal through the first and second wiring layers 31 and 32 and the electrode plugs 11 and 12 electrically connected to the resistance layer 33. Then, in the signal processing circuit unit 4, a change in electric resistance of the resistance layer 33 is converted into a change in voltage or current and light is detected on the basis of a change in voltage or current.

Figure 6:
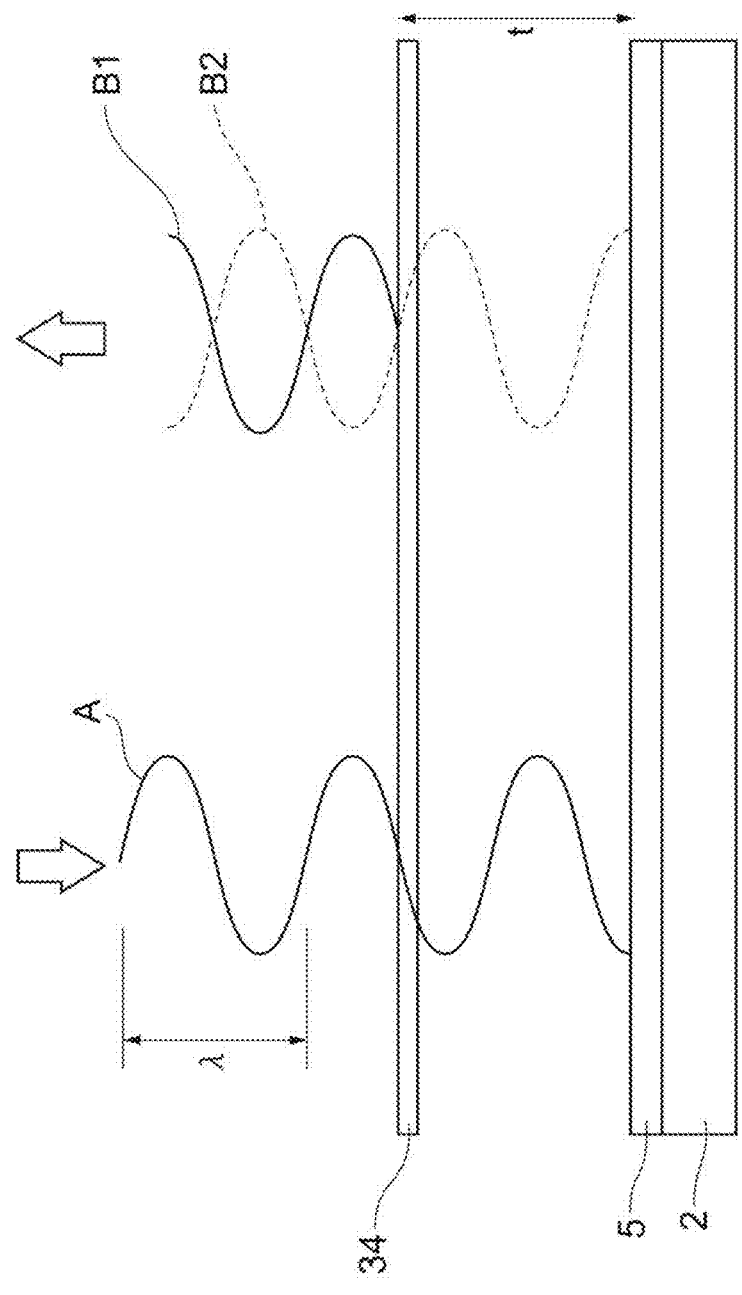
FIG. 6 is a diagram illustrating a principle of an optical resonance structure.

Next, the optical resonance structure will be described in detail. As illustrated in FIG. 6, a part of incident light A (having a wavelength λ) incident to the light absorption layer 34 is reflected as reflected light B1 by the light absorption layer 34 and the other part of the incident light A is transmitted through the light absorption layer 34. The other part of the incident light A transmitted through the light absorption layer 34 is reflected as reflected light B2 by the light reflection layer 5. Then, the reflected light B1 and the reflected light B2 interfere with each other to disappear on the reflection surface of the light absorption layer 34. Accordingly, the incident light A is absorbed on the reflection surface of the light absorption layer 34. Then, heat is generated in the light absorption layer 34 due to the energy of the absorbed incident light A.

The absorption rate of the incident light A can be determined by a sheet resistance of the light absorption layer 34 and an optical distance t between the light absorption layer 34 and the light reflection layer 5. The thickness of the light absorption layer 34 is set to about 16 nm (when the material of the light absorption layer 34 is $WSi_2$) so that the sheet resistance becomes a vacuum impedance (377 Ω/sq). Accordingly, the amplitude of the reflected light B1 reflected by the light absorption layer 34 matches the amplitude of the reflected light B2 reflected by the light reflection layer 5. For this reason, the reflected light B1 and the reflected light B2 efficiently interfere with each other to disappear on the reflection surface of the light absorption layer 34. Thus, the absorption rate of the incident light A is improved.

Further, the optical distance t is set so that t=(2 m−1)λ/4 (m=1, 2, 3, . . . ). Accordingly, the phases of the reflected light B1 and the reflected light B2 are shifted by 180°. For this reason, the reflected light B1 and the reflected light B2 efficiently interfere with each other to disappear on the reflection surface of the light absorption layer 34. Thus, the absorption rate of the incident light A is improved. In this way, the light reflection layer 5 constitutes an optical resonance structure along with the light absorption layer 34. When viewed from the thickness direction of the substrate 2, the incident light A is efficiently absorbed as the area of the overlapping portion between the light reflection layer 5 and the light absorption layer 34 becomes wider.

As described above, in the light detector 1 of the embodiment, the first region 34a of the light absorption layer 34 spreads to the side opposite to the second wiring layer 32 with respect to the first wiring layer 31 and the second region 34b of the light absorption layer 34 spreads to the side opposite to the first wiring layer 31 with respect to the second wiring layer 32 when viewed from the thickness direction of the substrate 2. That is, the first region 34a of the light absorption layer 34 does not overlap the first wiring layer 31 and the second region 34b of the light absorption layer 34 does not overlap the second wiring layer 32 when viewed from the thickness direction of the substrate 2. Accordingly, sufficient light absorption in the first region 34a and the second region 34b of the light absorption layer 34 is realized. Further, the separation layer 35 is disposed between the first wiring layer 31 and the light absorption layer 34, and the second wiring layer 32 and the absorption layer 34. Accordingly, since the heat generated in the light absorption layer 34 is suppressed from escaping to the substrate 2 through the first wiring layer 31 and the second wiring layer 32, the heat is sufficiently transmitted to the resistance layer 33 through the separation layer 35. As described above, according to the light detector 1, sensitivity can be improved. The sensitivity means an ability of detecting light by the light detector 1. For example, it is understood that the sensitivity of the light detector 1 is high when the light detector 1 can detect weak light and the sensitivity of the light detector 1 is low when the light detector 1 cannot detect strong light.

Further, since the separation layer 35 is disposed between the first wiring layer 31 and the light absorption layer 34, and the second wiring layer 32 and the absorption layer 34, the membrane 20 is difficult to warp. Further, each of the first wiring layer 31 and the second wiring layer 32 is formed in the light receiving portion 21 to cross the light receiving portion 21. Accordingly, since the membrane 20 is reliably supported by the first wiring layer 31 and the second wiring layer 32, it is possible to suppress the distortion and deformation of the resistance layer 33 between the first wiring layer 31 and the second wiring layer 32.

Further, in the light detector 1, the light reflection layer 5 is disposed on the surface 2a of the substrate 2 and constitutes an optical resonance structure along with the light absorption layer 34. According to this configuration, it is possible to realize light absorption in a wavelength region corresponding to a distance between the light absorption layer 34 and the light reflection layer 5.

Further, in the light detector 1, the total area of the first wiring layer 31 and the second wiring layer 32 is smaller than each area of the first region 34a and the second region 34b when viewed from the thickness direction of the substrate 2. According to this configuration, since more sufficient light absorption in the first region 34a and the second region 34b of the light absorption layer 34 is realized and the heat generated in the light absorption layer 34 is further suppressed from escaping to the substrate 2 through the first wiring layer 31 and the second wiring layer 32, sensitivity can be further improved.

Further, in the light detector 1, the length of each of the first wiring layer 31 and the second wiring layer 32 in a direction along the line L is larger than the width of each of the first wiring layer 31 and the second wiring layer 32 in a direction perpendicular to the line L when viewed from the thickness direction of the substrate 2. According to this configuration, since the gap G is lengthened, sensitivity can be further improved.

Further, in the light detector 1, the thickness of the separation layer 35 is larger than the thickness of each of the first wiring layer 31, the second wiring layer 32, the resistance layer 33, and the light absorption layer 34. According to this configuration, since the heat generated in the light absorption layer 34 is further suppressed from escaping to the substrate 2 through the first wiring layer 31 and the second wiring layer 32, sensitivity can be further improved. Further, according to this configuration, it is possible to improve the strength of the membrane 20 and to suppress the deformation of the membrane 20.

Further, in the light detector 1, the first region 34a and the second region 34b of the light absorption layer 34 are formed on the resistance layer 33 with the separation layer 35 interposed therebetween. Further, the resistance layer 33 and the separation layer 35 are respectively formed continuously over the first region 34a and the second region 34b. According to this configuration, it is possible to suppress the deformation and warpage of the membrane 20 and to simplify the process of manufacturing the light detector 1.

Although the embodiment of the invention has been described above, an aspect of the invention is not limited to the above-described embodiment.

In the above-described embodiment, an example in which the membrane 20 has, for example, a rectangular shape when viewed from the thickness direction of the substrate 2 has been described, but the invention is not limited thereto. The membrane 20 may have, for example, various shapes such as a circular shape when viewed from the thickness direction of the substrate 2.

Further, an example is illustrated in which the positions of the first wiring layer 31 and the second wiring layer 32 in the thickness direction of the substrate 2 match each other, but the positions of the first wiring layer 31 and the second wiring layer 32 in the thickness direction of the substrate 2 may not match each other.

Figure 7:
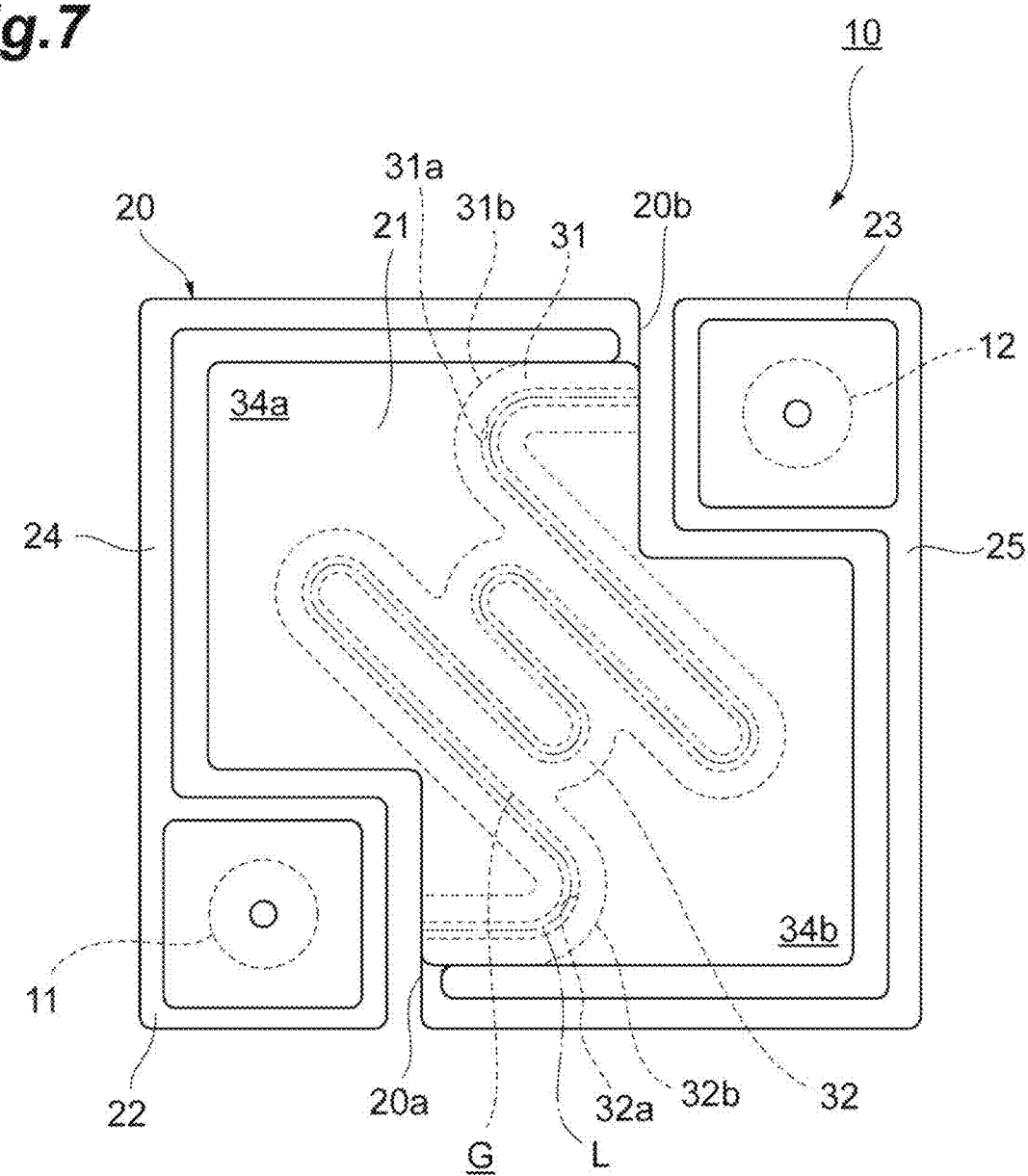
FIG. 7 is a plan view of a light detecting element of a modified example.

Further, an example in which the line L extends in a linear shape to connect, for example, the electrode portion 22 and the electrode portion 23 when viewed from the thickness direction of the substrate 2 has been described, but the invention is not limited thereto. As illustrated in FIG. 7, the line L may extend, for example, in a meandering shape having a curved portion when viewed from the thickness direction of the substrate 2. Accordingly, since the gap G is lengthened as compared with a case in which the line L is linear, sensitivity can be improved. Additionally, when the line L has a curved portion, a direction perpendicular to the line L means a direction perpendicular to a tangent line at each position of the line L. Directions perpendicular to the line L are different at each position of the curved portion, respectively.

Further, the resistance layer 33 may not be formed in, for example, a region corresponding to the electrode portions 22 and 23, the beam portions 24 and 25, and the first region 34a and a region corresponding to the second region 34b.

Further, the separation layer 35 may not be disposed in, for example, a region corresponding to the electrode portions 22 and 23, the beam portions 24 and 25, and the first region 34a and a region corresponding to the second region 34b. Further, the thickness of the separation layer 35 may be equal to or smaller than the thickness of each of the first wiring layer 31, the second wiring layer 32, the resistance layer 33, and the light absorption layer 34. Further, the material of the separation layer 35 may be the same as that of the resistance layer 33 (see FIG. 9).

Further, the total area of the first wiring layer 31 and the second wiring layer 32 may be smaller than the total area of the first region 34a and the second region 34b when viewed from the thickness direction of the substrate 2. According to this configuration, as described above, since more sufficient light absorption in the first region 34a and the second region 34b of the light absorption layer 34 is realized and the heat generated in the light absorption layer 34 is further suppressed from escaping to the substrate 2 through the first wiring layer 31 and the second wiring layer 32, sensitivity can be further improved.

Figure 8:
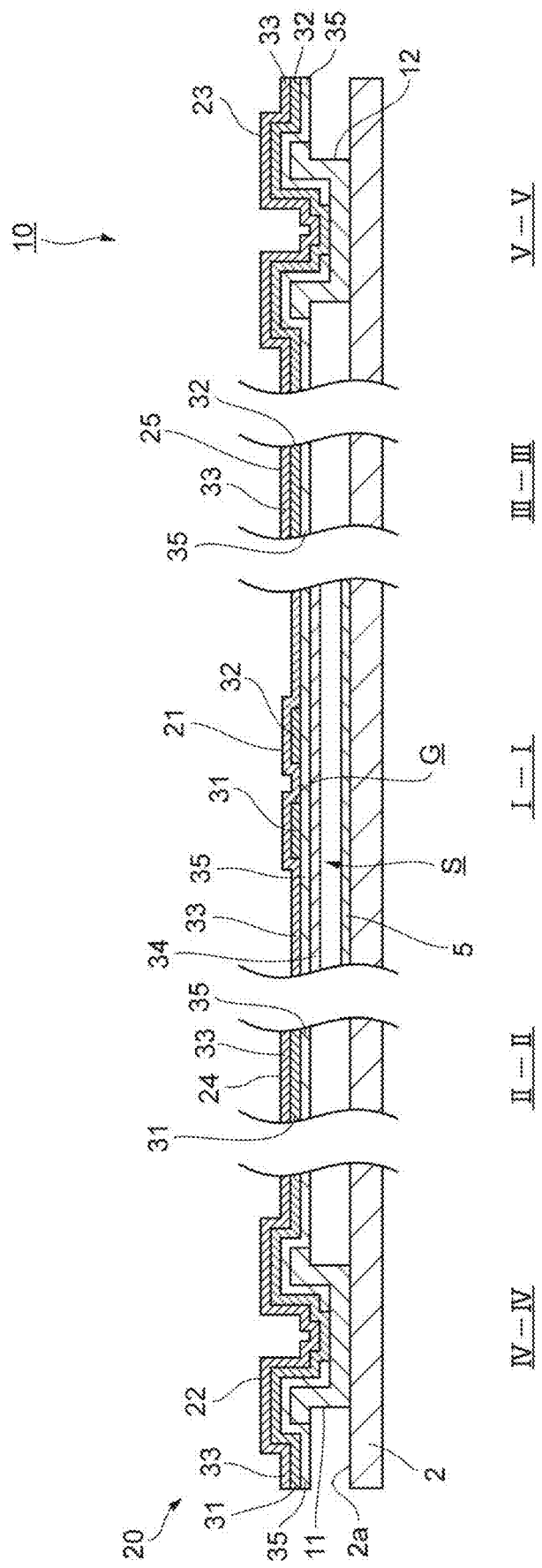
FIG. 8 is a cross-sectional view of the light detecting element of the modified example.

Further, as illustrated in FIG. 8, the separation layer 35 and the light absorption layer 34 may be formed on the side of the substrate 2 in the first wiring layer 31 and the second wiring layer 32. Specifically, the separation layer 35 is formed on the electrode plugs 11 and 12. The first wiring layer 31, the second wiring layer 32, and the resistance layer 33 are formed on the surface opposite to the substrate 2 in the separation layer 35. The light absorption layer 34 is formed on the surface at the side of the substrate 2 in the separation layer 35. Accordingly, the light absorption layer 34 and the light reflection layer 5 directly face each other with the space S interposed therebetween. For this reason, since it is easy to adjust the optical distance t, it is possible to more reliably absorb light by the optical resonance structure. Additionally, also in this case, the first wiring layer 31 is electrically connected to the electrode plug 11. The second wiring layer 32 is electrically connected to the electrode plug 12.

Figure 9:
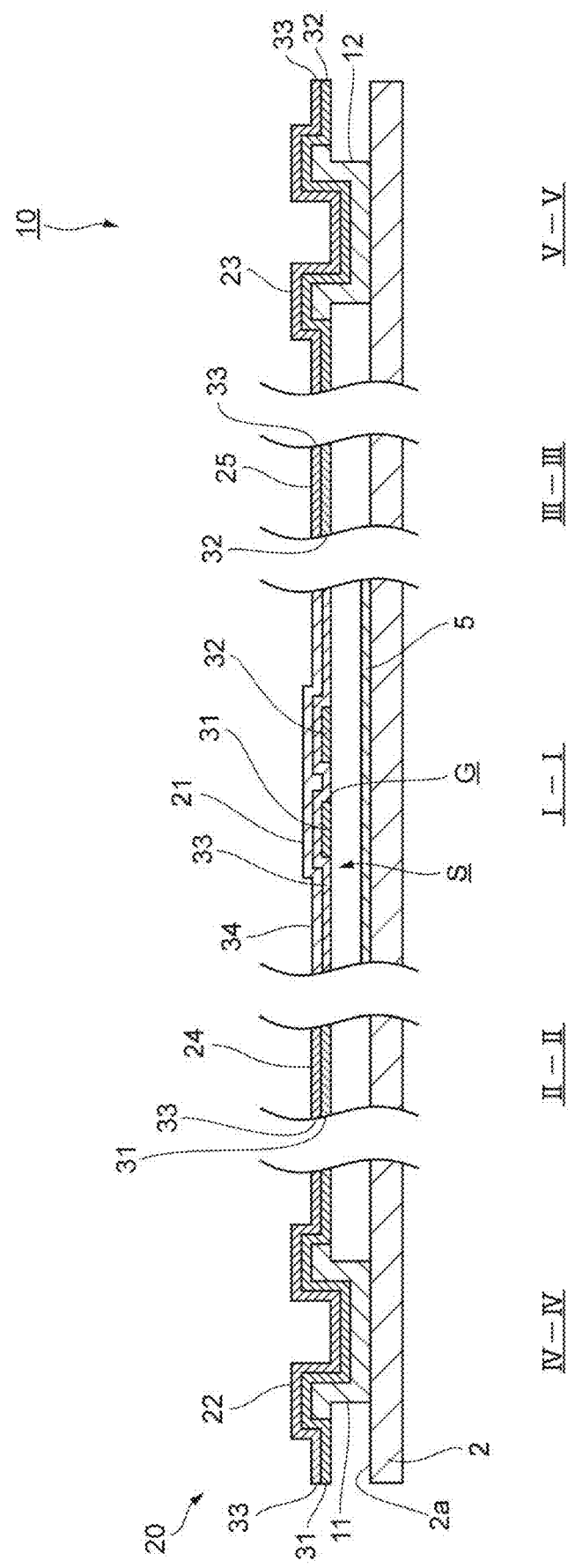
FIG. 9 is a cross-sectional view of the light detecting element of the modified example.

Further, as illustrated in FIG. 9, when the resistance layer 33 is formed between the first wiring layer 31 and the light absorption layer 34, and the second wiring layer 32 and the absorption layer 34, the membrane 20 may not include the separation layer 35. In this case, the resistance layer 33 serves as both the resistance layer 33 and the separation layer 35. Accordingly, since the thermal conductance of the membrane 20 is low, the response speed can be improved. The response speed indicates a change rate of the temperature of the membrane 20 with respect to time when the light (for example, the amount of light) incident to the light receiving portion 21 changes. For example, it is understood that the response speed is fast when the time taken until the temperature of the membrane 20 rises to a predetermined stable temperature is short in a case in which the amount of light incident to the light receiving portion 21 increases and the response speed is slow when the time is long in that case. Further, accordingly, since the element resistance of the membrane 20 is low, noise can be reduced.

Figure 10:
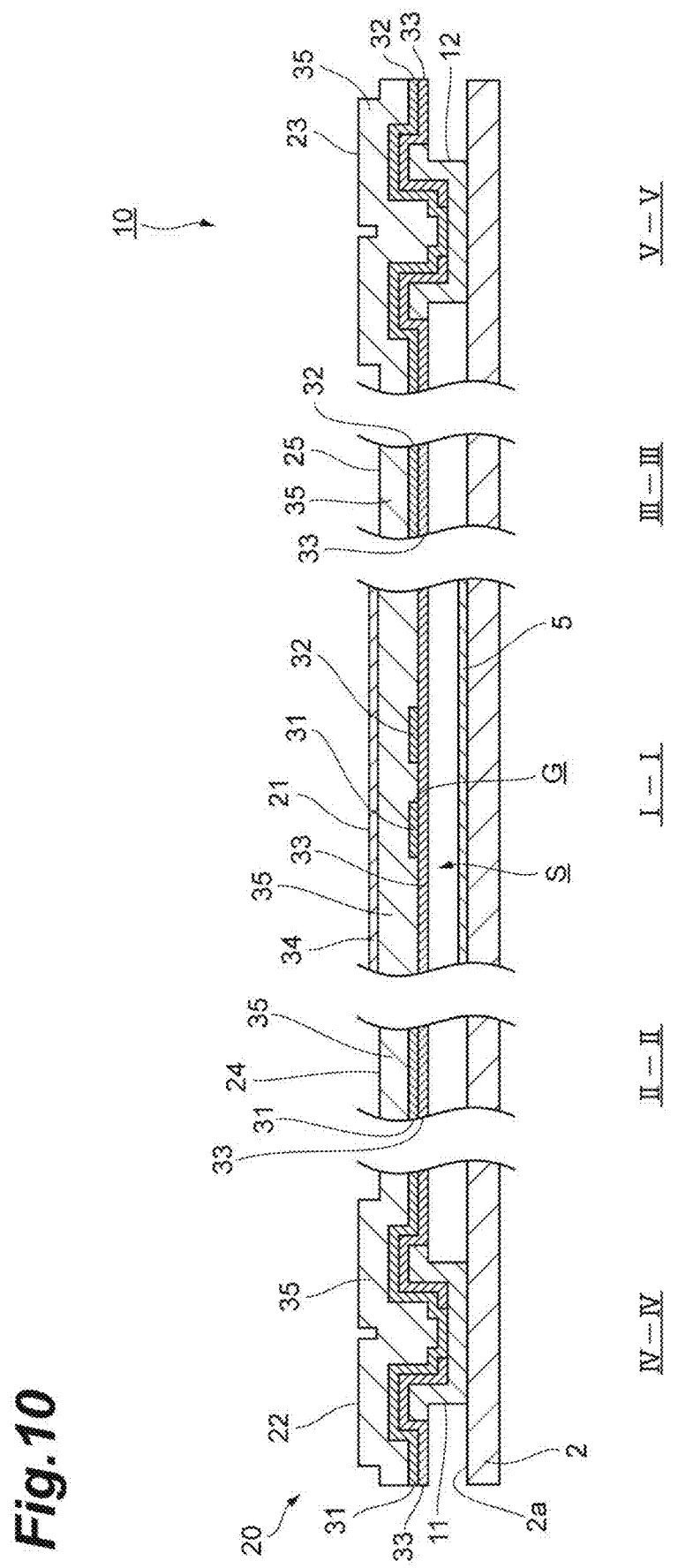
FIG. 10 is a cross-sectional view of the light detecting element of the modified example.

Further, as illustrated in FIG. 10, the resistance layer 33 may be formed on the side of the substrate 2 in the first wiring layer 31 and the second wiring layer 32. In this case, the resistance layer 33 is not disposed at the gap G Additionally, also in this case, the first wiring layer 31 is electrically connected to the electrode plug 11. The second wiring layer 32 is electrically connected to the electrode plug 12.

Figure 11:
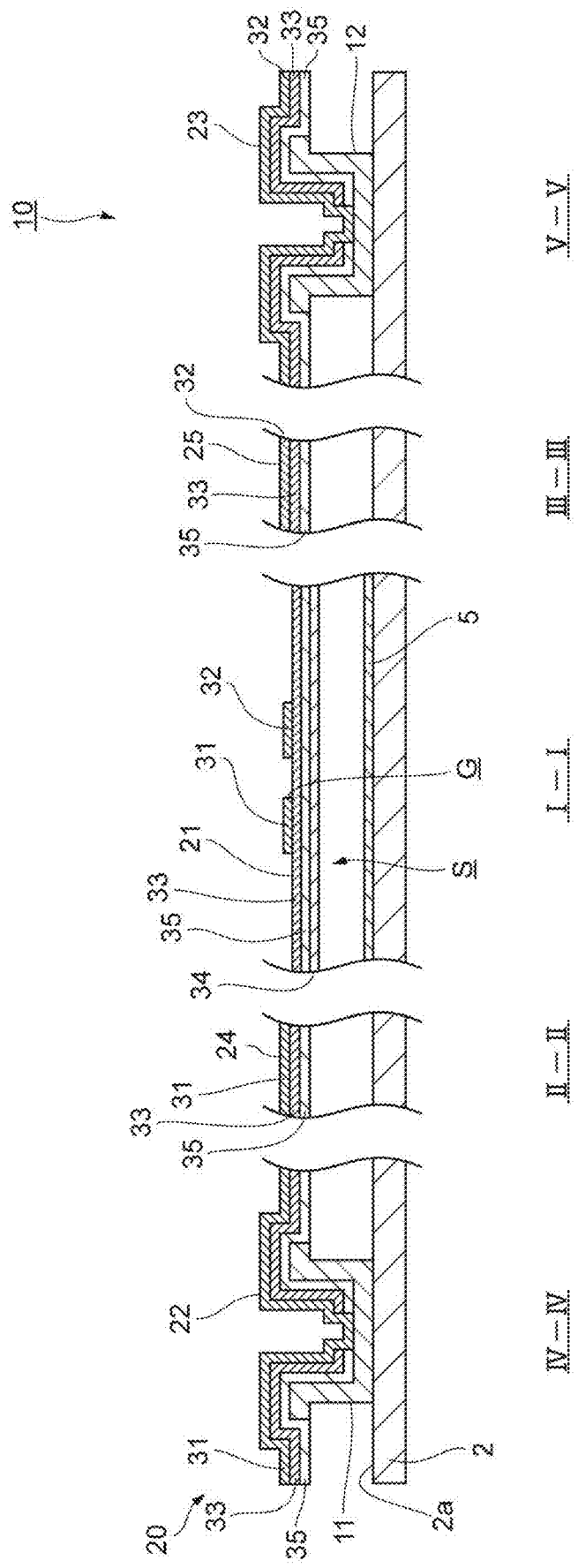
FIG. 11 is a cross-sectional view of the light detecting element of the modified example.

Further, as illustrated in FIG. 11, the resistance layer 33, the separation layer 35, and the light absorption layer 34 may be formed on the side of the substrate 2 in the first wiring layer 31 and the second wiring layer 32. Specifically, the separation layer 35 is formed on the electrode plugs 11 and 12. The resistance layer 33 is formed on the surface opposite to the substrate 2 in the separation layer 35. The first wiring layer 31 and the second wiring layer 32 are formed on the surface opposite to the substrate 2 in the resistance layer 33. The light absorption layer 34 is formed on the surface at the side of the substrate 2 in the separation layer 35. Additionally, also in this case, the first wiring layer 31 is electrically connected to the electrode plug 11. The second wiring layer 32 is electrically connected to the electrode plug 12.

Further, as illustrated in FIG. 12, the membrane 20 may not include the separation layer 35 when the resistance layer 33 is formed between the first wiring layer 31 and the light absorption layer 34, and the second wiring layer 32 and the absorption layer 34, also in a case in which the resistance layer 33 and the light absorption layer 34 are formed on the side of the substrate 2 in the first wiring layer 31 and the second wiring layer 32. That is, also in this case, the resistance layer 33 serves as both the resistance layer 33 and the separation layer 35. Additionally, also in this case, the first wiring layer 31 is electrically connected to the electrode plug 11. The second wiring layer 32 is electrically connected to the electrode plug 12.

Further, in the above-described configurations, the material of the light absorption layer 34 may be, for example, a material having a large absorption rate with respect to light such as black resin. Additionally, in this case, the optical resonance structure is not provided and light is directly absorbed by the light absorption layer 34. Accordingly, as described above, the optical distance t may not be accurately adjusted. Additionally, it is desirable that the light detecting element 10 include the light reflection layer 5 even when the optical resonance structure is not provided. The reason is as below. When a part of the incident light A incident to the light absorption layer 34 is not absorbed by the light absorption layer 34 and is transmitted through the membrane 20, the incident light A transmitted through the membrane 20 is reflected by the light reflection layer 5 and is again incident to the light absorption layer 34. The incident light A which is incident to the light absorption layer 34 again is absorbed by the light absorption layer 34 to become heat. Accordingly, the absorption rate of the light is improved. Further, when the separation layer 35 is disposed between the light absorption layer 34 and the resistance layer 33 in a case in which the material of the light absorption layer 34 is black resin, the light absorption layer 34 contacts the resistance layer 33 so that an influence on the characteristic of the resistance layer 33 is suppressed.

Further, in the above-described configurations, the separation layer 35 may be further formed on the surface at the side of the substrate 2 in the membrane 20. Accordingly, it is possible to stabilize the resistance layer 33 and to make the membrane 20 harder to warp.

Further, each of the first wiring layer 31, the second wiring layer 32, the resistance layer 33, the light absorption layer 34, and the separation layer 35 can be formed with various materials and thicknesses. When each of the first wiring layer 31, the second wiring layer 32, the resistance layer 33, and the separation layer 35 is formed with optimal materials and thicknesses, the sensitivity can be easily improved and the strength of the membrane 20 can be improved. Further, it is possible to improve both sensitivity and response speed by selecting an optimal material for each of the first wiring layer 31, the second wiring layer 32, and the light absorption layer 34 as compared with a conventional structure (for example, see Patent Literature 1) using the wiring layer as the light absorption layer.

Further, the pixel unit 3 may constituted by one light detecting element 10.

REFERENCE SIGNS LIST

1: light detector, 2: substrate, 2a: surface, 20: membrane, 31: first wiring layer, 32: second wiring layer, 33: resistance layer, 34: light absorption layer, 34a: first region, 34b: second region, 35: separation layer, 5: light reflection layer, L: line, S: space, G: gap.

The invention claimed is:

1. A light detector comprising:
a substrate; and
a membrane which is supported on a surface of the substrate so that a space is formed between the surface of the substrate and the membrane,
wherein the membrane includes a first wiring layer and a second wiring layer which are opposite each other with a gap extending along a line interposed therebetween, a resistance layer which is electrically connected to each of the first wiring layer and the second wiring layer and has an electric resistance depending on a temperature, a light absorption layer which is opposite to the surface of the substrate, and a separation layer which is disposed between the first wiring layer and the light absorption layer, and the second wiring layer and the absorption layer, and
wherein the light absorption layer includes a first region which spreads to the side opposite to the second wiring layer with respect to the first wiring layer when viewed from the thickness direction of the substrate and a second region which spreads to the side opposite to the first wiring layer with respect to the second wiring layer when viewed from the thickness direction of the substrate.

2. The light detector according to claim 1, further comprising:
a light reflection layer which is disposed on the surface of the substrate and constitutes an optical resonance structure along with the light absorption layer.

3. The light detector according to claim 1,
wherein a total area of the first wiring layer and the second wiring layer is smaller than a total area of the first region and the second region when viewed from the thickness direction of the substrate.

4. The light detector according to claim 1,
wherein a total area of the first wiring layer and the second wiring layer is smaller than a area of each of the first region and the second region when viewed from the thickness direction of the substrate.

5. The light detector according to claim 1,
wherein a length of each of the first wiring layer and the second wiring layer in a direction along the line is larger than a width of each of the first wiring layer and the second wiring layer in a direction perpendicular to the line when viewed from the thickness direction of the substrate.

6. The light detector according to claim 1,
wherein a thickness of the separation layer is larger than a thickness of each of the first wiring layer, the second wiring layer, the resistance layer, and the light absorption layer.

7. The light detector according to claim 1,
wherein a thickness of the separation layer is smaller than a thickness of the resistance layer.

* * * * *